(12) United States Patent
Easwaran et al.

(10) Patent No.: US 7,868,688 B2
(45) Date of Patent: Jan. 11, 2011

(54) LEAKAGE INDEPENDENT VERY LOW BANDWITH CURRENT FILTER

(75) Inventors: Prakash Easwaran, Bangalore (IN); Prasenjit Bhowmik, Bangalore (IN); Sumeet Mathur, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 0 days.

(21) Appl. No.: 12/463,389

(22) Filed: May 9, 2009

(65) Prior Publication Data

US 2010/0164611 A1 Jul. 1, 2010

(30) Foreign Application Priority Data

Dec. 30, 2008 (IN) .................... 3317/CHE/2008

(51) Int. Cl.
*H03K 5/00* (2006.01)
(52) U.S. Cl. ........................ 327/558; 327/552
(58) Field of Classification Search ......... 327/551–559, 327/336–337, 344
See application file for complete search history.

(56) References Cited

U.S. PATENT DOCUMENTS

| | | | | |
|---|---|---|---|---|
| 5,444,579 A | * | 8/1995 | Klein et al. ................. | 360/67 |
| 5,572,161 A | * | 11/1996 | Myers ........................ | 327/538 |
| 6,788,161 B2 | * | 9/2004 | Vilander ..................... | 331/185 |
| 7,119,605 B2 | * | 10/2006 | Eberlein ..................... | 327/538 |
| 7,184,253 B1 | * | 2/2007 | Hartranft et al. ............ | 361/111 |
| 7,218,170 B1 | * | 5/2007 | Carter et al. ................ | 327/552 |

* cited by examiner

*Primary Examiner*—Dinh T. Le
(74) *Attorney, Agent, or Firm*—Kanika Radhakrishnan; Evergreen Valley Law Group P.C.

(57) ABSTRACT

A current filter circuit is provided. The current filter circuit comprises a source transistor comprising a drain, a gate, and a source. The source of the source transistor is coupled to a reference voltage terminal, the gate of the source transistor is coupled to the gate of a mirror transistor, and the drain of the source transistor is coupled to a reference current source. The mirror transistor comprises a drain, a gate, and a source. The source of the mirror transistor is coupled to the reference voltage terminal, the gate is coupled to the gate of the source transistor, and the drain is coupled to a load. The current filter circuit comprises a low pass filter for filtering noise. The current filter circuit also comprises an impedance reduction circuit coupled to the drain of the mirror transistor for reducing bandwidth of the current filter circuit.

6 Claims, 6 Drawing Sheets

LEAKAGE INDEPENDENT VERY LOW BANDWITH CURRENT FILTER

BACKGROUND

This patent application claims priority from Indian Non provisional patent application number 3317/CHE/2008, filed on Dec. 30, 2008 entitled "LEAKAGE INDEPENDENT VERY LOW BANDWIDTH CURRENT FILTER" and assigned to Cosmic Circuits Private Limited., 303, A Block, AECS Layout, Kundalahalli, Bangalore-560037, India, which is hereby incorporated in its entirety.

FIELD

Embodiments of the present disclosure relate generally to filters and more particularly to current filters.

PRIOR ART

The use of filters in amplifier circuitry is well known. The filters are used to remove unwanted signals or noise in a circuit. Typical noise contributors are the reference and the power supply of the amplifier circuitry. The filters are used in a wide range of application such as voltage regulators, microphone amplifiers, radio frequency amplifiers, etc.

Often in electronic circuits, current mirror circuits are used to provide bias currents to a circuit. Typically, a current mirror circuit comprises a source transistor 110 mirrored to a mirror transistor 105. The mirroring includes coupling the gate of the source transistor 110 and the gate of the mirror transistor 105. The source transistor 110 is provided with a current source 125.

Further, in order to reject noise from the transistor and power supply, often a filter is coupled to the current mirror circuit. The current filter comprises a resistor 115 placed between the gate of source transistor 110 and the gate of the mirror transistor 105. The resistor 115 is coupled to a capacitor 120. The noise in the current source 125 and the source transistor 110 is filtered by the resistor 115 and the capacitor 120. The pole frequency of the filter is given below:

Pole frequency=$1/(2*\Pi*R*C)$, where R is the resistance of the resistor 115 and C is the capacitance of the capacitor 120.

Typically, the resistor has high resistance value in order to filter low frequency noise. However, such high resistance will lead to large voltage drops in the presence of gate leakage and may result in error in mirror current. A schematic diagram of the current filter in the current mirror circuit is shown in FIG. 1.

In light of the foregoing discussion, there is a need for a filter to achieve leakage current independent mirroring of the transistors.

SUMMARY

Embodiments of the current disclosure described herein provide a current filter circuit to filter noise in the current mirror circuit. A current filter circuit with resistor implementation without causing errors in the mirror current is provided.

The current filter circuit comprises a source transistor and a mirror transistor. The source transistor comprises a drain, a gate, and a source. The source of the source transistor is coupled to a reference voltage terminal. The gate of the source transistor is coupled to the gate of the mirror transistor. The drain of the source transistor is coupled to a reference current source. The mirror transistor comprises a drain, a gate, and a source. The source of the mirror transistor is coupled to the reference voltage terminal. The gate is coupled to the gate of the source transistor. Further, the drain is coupled to a load.

The current filter circuit further comprises a low pass filter for filtering noise in the current filter circuit. The low pass filter is coupled between the drain of the source transistor and the reference voltage terminal. The input to the low pass filter is the drain of the source transistor and output of the low pass filter is coupled to gate terminal of the mirror transistor and the source transistor. Further, an impedance reduction circuit is coupled to the current filter circuit for reducing bandwidth of the current filter circuit.

In an embodiment, the impedance reduction circuit comprises a transistor coupled to the source transistor. The transistor and the source transistor are coupled to a current source.

In another embodiment, the impedance reduction circuit is a resistor coupled to a reference voltage. The reference voltage is generated by one or more combinations of transistors, capacitors, resistors, and inductors.

Other aspects and example embodiments are provided in the figures and the detailed description that follows.

DETAILED DESCRIPTION OF THE EMBODIMENTS

Embodiments of the current disclosure described herein provide a current filter circuit to filter noise in current mirror circuit.

Figure 1:
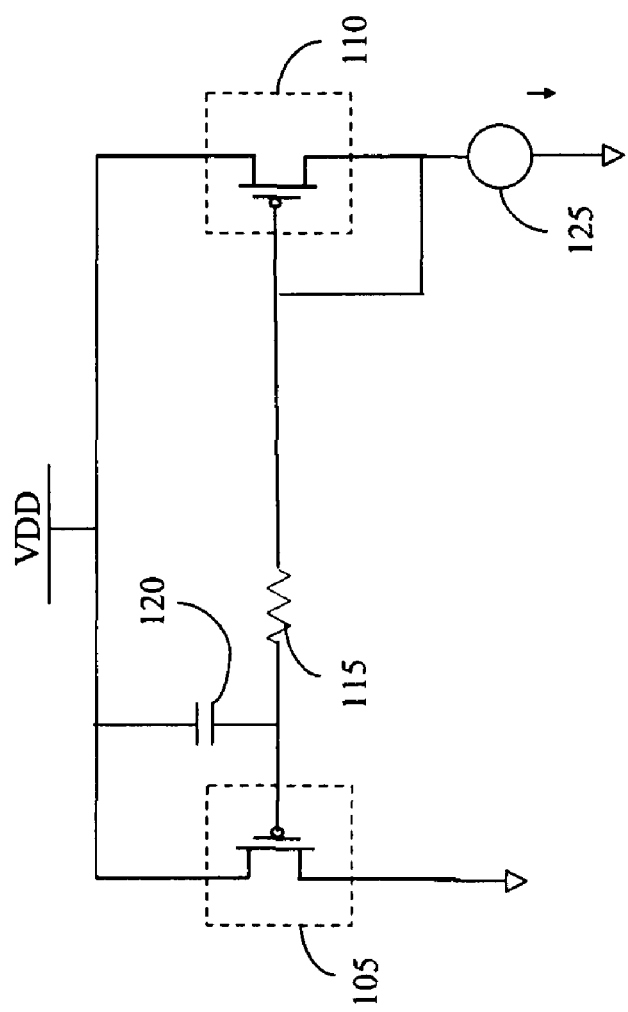
FIG. 1 is a schematic diagram of an existing current mirror circuit employing a filter.
Figure 2:
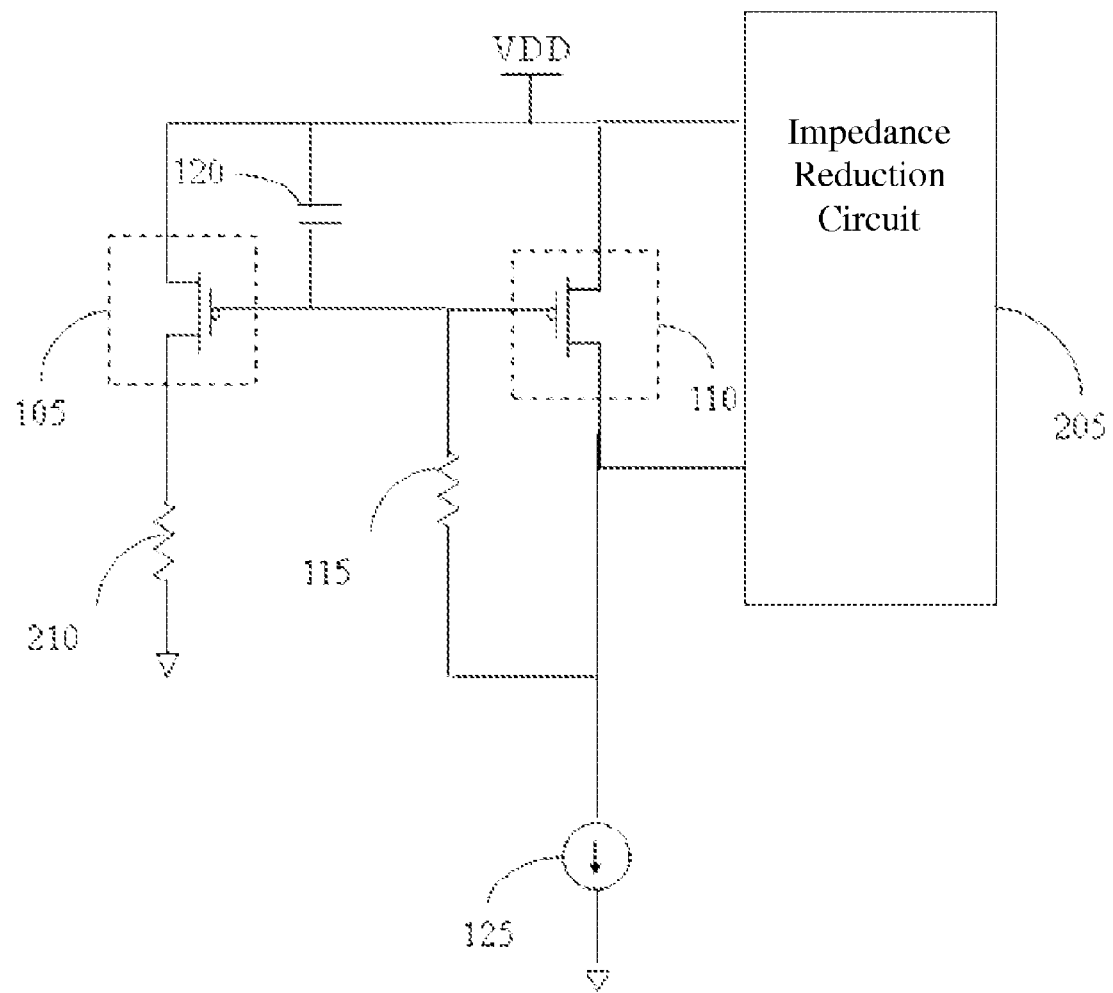
FIG. 2 is a schematic diagram of a current filter circuit coupled to an impedance reduction circuit, in accordance with which various embodiments can be implemented.

FIG. 2 is a schematic diagram of a current filter circuit coupled to an impedance reduction circuit 205, in accordance with which various embodiments can be implemented.

The current filter circuit includes a source transistor 110 and a mirror transistor 105. The source transistor 110 includes a drain, a gate, and a source. The source of the source transistor 110 is coupled to a reference voltage terminal (VDD). The gate of the source transistor 110 is coupled to the gate of the mirror transistor 105. The drain of the source transistor 110 is coupled to a reference current source 125.

The mirror transistor 105 includes a drain, a gate, and a source. The source of the mirror transistor 105 is coupled to the VDD. The gate of the mirror transistor 105 is coupled to the gate of the source transistor 110. Further, the drain of the mirror transistor 105 is coupled to a load 210.

The current filter circuit further includes a low pass filter for filtering noise in the current filter circuit. The low pass filter includes a capacitor and resistor. The low pass filter is coupled between the drain of the source transistor 105 and the}

VDD. The input to the low pass filter is the drain of the source transistor 105 and output of the low pass filter is coupled to gate terminal of the mirror transistor 105 and the source transistor 110. The pole frequency of the low pass filter is given below:

Pole frequency=gm*Rout/(2*Π*R*C), where R is the resistance of the resistor 115 and C is the capacitance of the capacitor 120, gm is the trans-conductance of the source transistor 105 and Rout is the impedance at drain of the source transistor 105.

The low pass filter implementation in the current filter circuit provides an improved technique of filtering noise in the current filter circuit, since the gate leakage does not have a significant impact on the output current. Further, a low bandwidth is desired in the current filter circuit. To achieve low bandwidth in the current filter circuit the gain of the current filter circuit has to be reduced. Hence, an impedance reduction circuit 205 is coupled to the current filter circuit for reducing bandwidth of the current filter circuit. The impedance reduction circuit 205 has low input impedance.

The impedance reduction circuit 205 is implemented using one or more circuit combinations. The various implementations of the impedance reduction circuit 205 are explained in detail in conjunction with FIG. 3 through FIG. 6.

Figure 3:
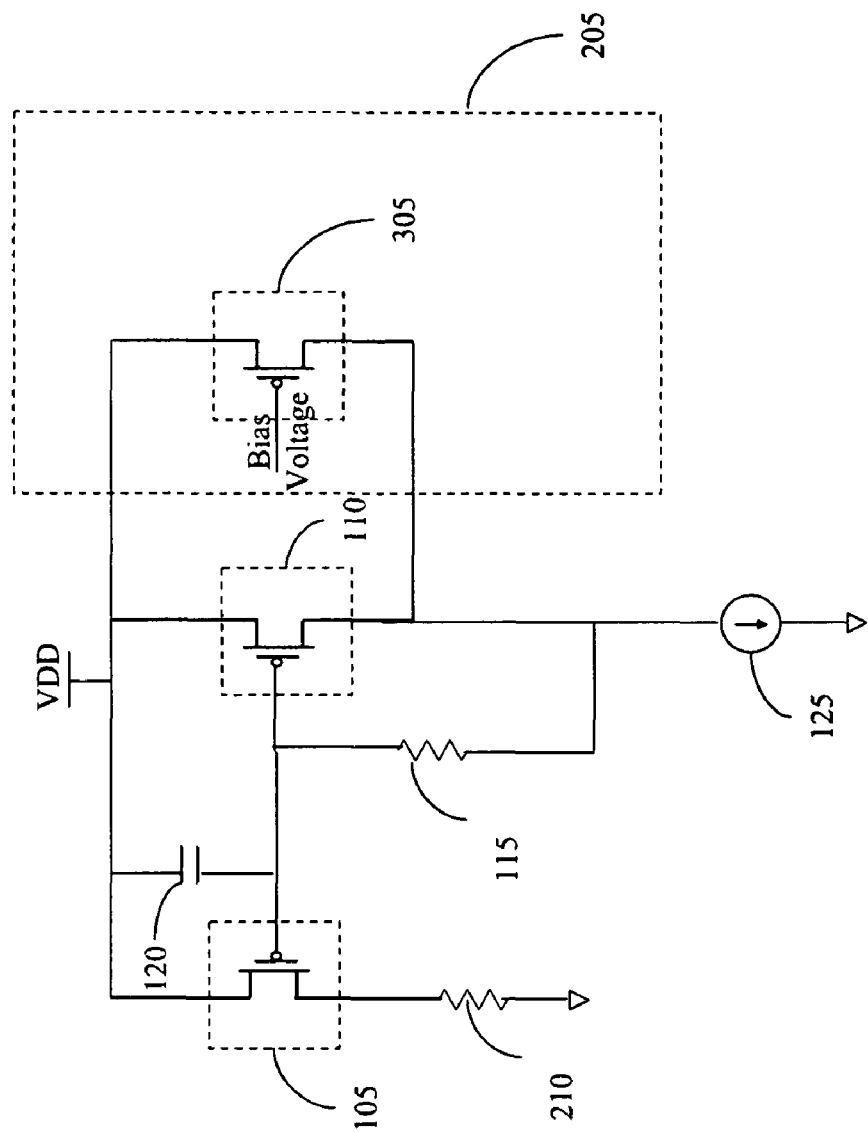
FIG. 3 is a schematic diagram of the current filter circuit coupled to the impedance reduction circuit, in accordance with one embodiment.

FIG. 3 is a schematic diagram of the current filter circuit coupled to the impedance reduction circuit 205, in accordance with one embodiment.

The impedance reduction circuit 205 illustrated in FIG. 3 includes a transistor 305 coupled to the source transistor 110. The drain of the transistor 305 and the drain of the source transistor 110 are coupled to the current source 125. The source of the transistor 305 is coupled to VDD. Further, the gate of the transistor 305 is provided with a bias voltage. The implementation of the transistor 305 brings about a reduction in gain in the current filter circuit and thereby achieving a low bandwidth current filter circuit.

Figure 4:
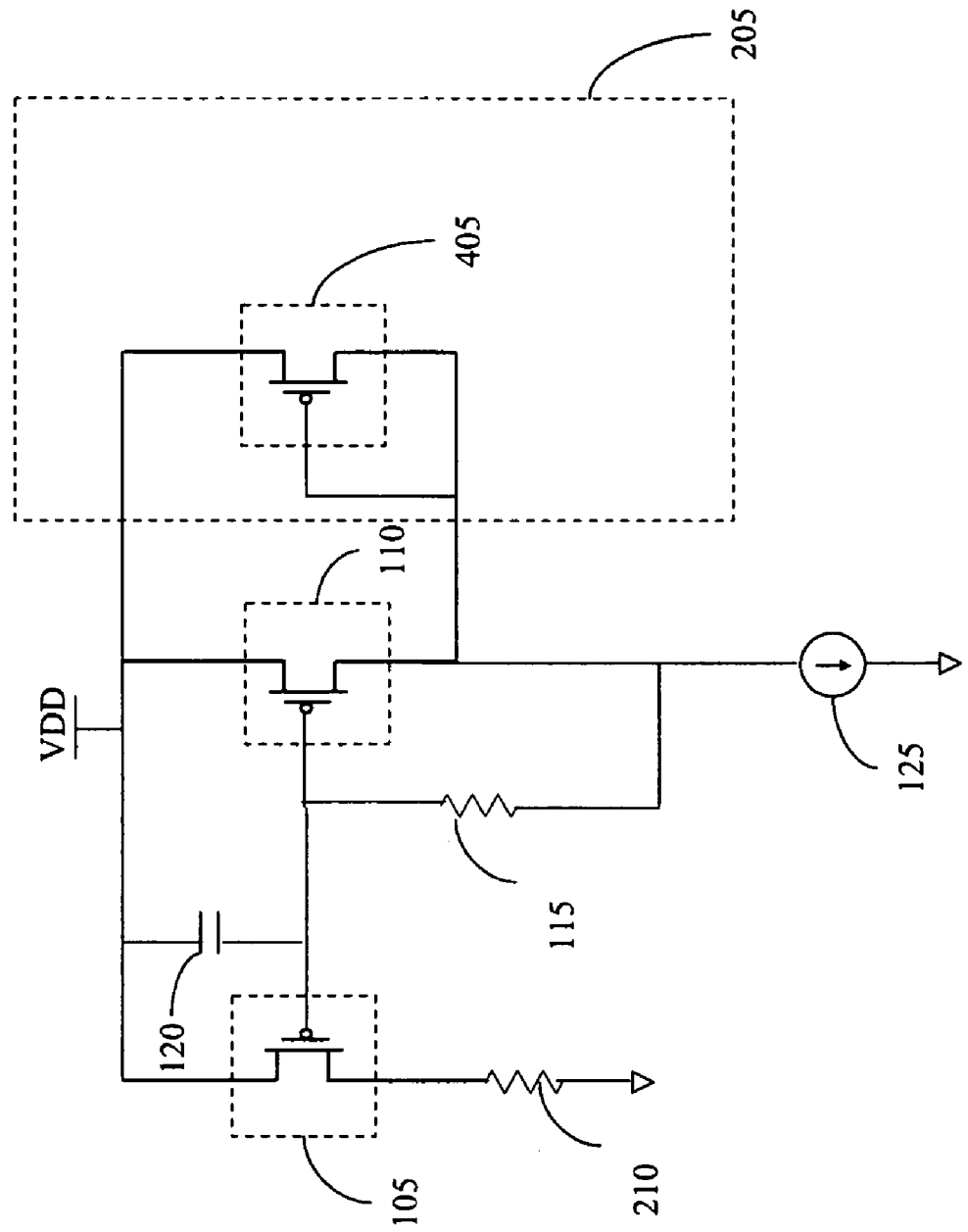
FIG. 4 is a schematic diagram of the current filter circuit coupled to the impedance reduction circuit, in accordance with another embodiment.

FIG. 4 is a schematic diagram of the current filter circuit coupled to the impedance reduction circuit 205, in accordance with another embodiment.

The impedance reduction circuit 205 illustrated in FIG. 4 includes a transistor 305 coupled to the source transistor 110. The drain of the transistor 405 and the drain of the source transistor 110 are coupled to the current source 125. The source of the transistor 405 is coupled to VDD. Further, the gate of the transistor 405 and the drain of the transistor 405 are shorted. The implementation of the transistor 405 brings about a reduction in gain in the current filter circuit and thereby achieving a low bandwidth current filter circuit.

Figure 5:
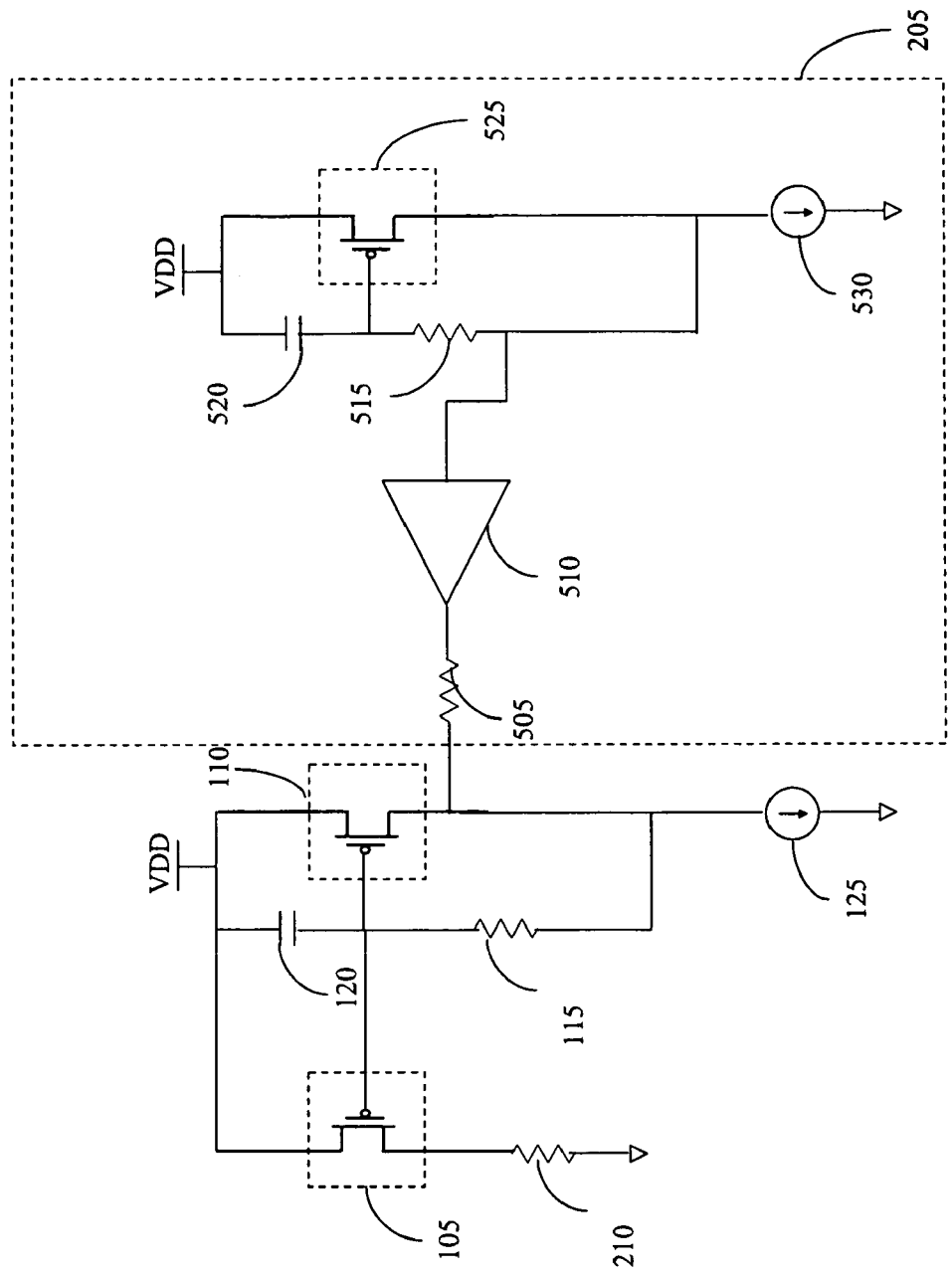
FIG. 5 is a schematic diagram of the current filter circuit coupled to the impedance reduction circuit, in accordance with another embodiment.

FIG. 5 is a schematic diagram of the current filter circuit coupled to the impedance reduction circuit 205, in accordance with another embodiment.

In another embodiment, the impedance reduction circuit 205 is a resistor coupled to a reference voltage. The reference voltage is generated by one or more combinations of transistors, capacitors, resistors, and inductors. FIG. 5 exemplarily illustrates the generation of a reference voltage using a replica of the current filter circuit. The replica of the current filter circuit comprises a resistor 515 and a capacitor 520 coupled to a transistor 525. The drain of the transistor 525 is coupled to a current source 530. The source of the transistor 525 is coupled to the VDD. Furthermore, the source transistor 110 is coupled to a buffer 510 through a resistor 505. The buffer 510 is coupled to the current source 530.

Figure 6:
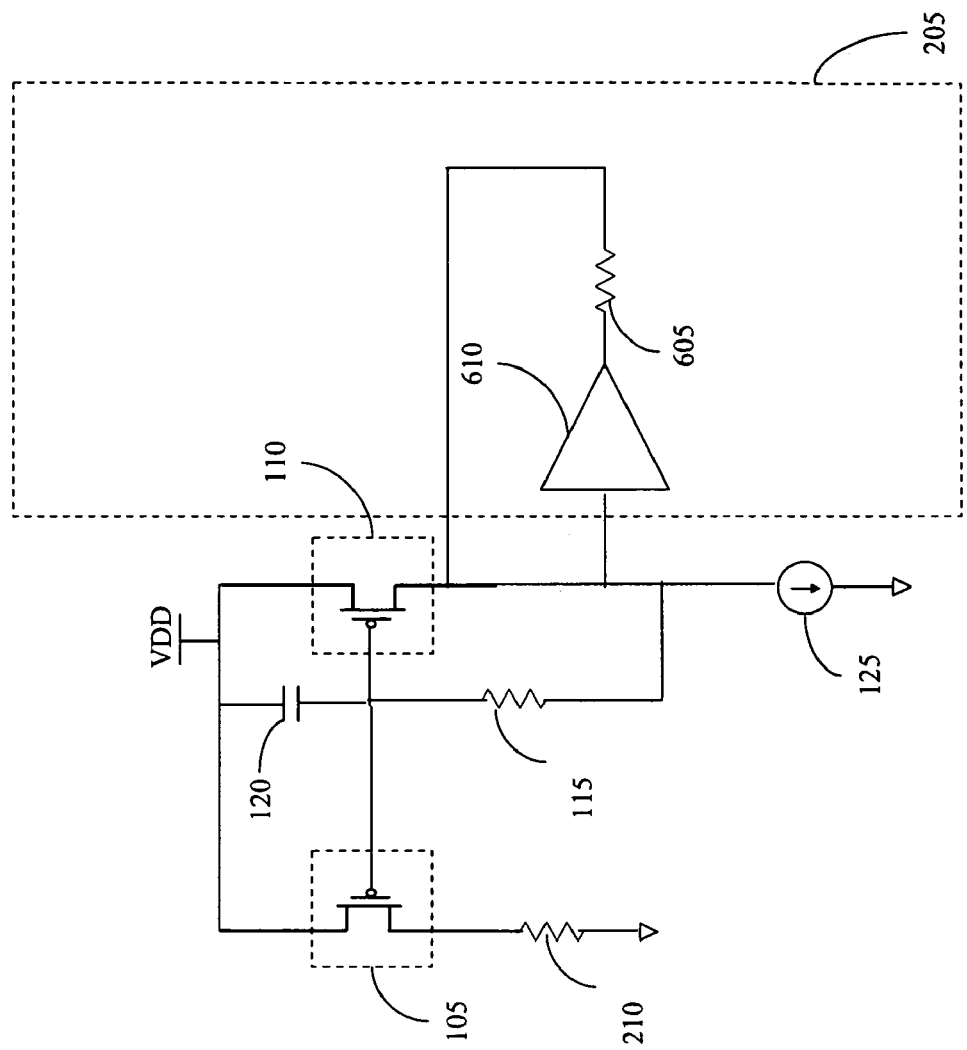
FIG. 6 is a schematic diagram of the current filter circuit coupled to the impedance reduction circuit, in accordance with another embodiment.

FIG. 6 is a schematic diagram of the current filter circuit coupled to the impedance reduction circuit 205, in accordance with another embodiment.

In another exemplary embodiment, the impedance reduction circuit 205 comprises a buffer feedback circuit. The buffer feedback circuit comprises a resistor 605 and a buffer 610. The current at the drain of the source transistor is buffered and fed back to the current mirror circuit.

In the foregoing discussion, the term "coupled" refers to either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A current filter circuit, the current filter circuit comprising:
    a source transistor comprising a drain, a gate, and a source, wherein the source of the source transistor is coupled to a reference voltage terminal, the gate of the source transistor is coupled to the gate of a mirror transistor, and the drain of the source transistor is coupled to a reference current source;
    the mirror transistor comprising a drain, a gate, and a source, wherein the source of the mirror transistor is coupled to the reference voltage terminal, the gate is coupled to the gate of the source transistor, and the drain is coupled to a load;
    a low pass filter for filtering noise in the current filter circuit, the low pass filter coupled between the drain of the source transistor and the reference voltage terminal, the input to the low pass filter being the drain of the source transistor and output being coupled to gate terminal of the mirror transistor and the source transistor, and
    an impedance reduction circuit coupled to the drain of the mirror transistor, wherein the impedance reduction circuit reduces bandwidth of the current filter circuit by reducing gain of the source transistor.

2. The current filter circuit of claim 1, wherein the impedance reduction circuit has low input impedance.

3. The current filter circuit of claim 1, wherein the impedance reduction circuit is a resistor coupled to a reference voltage, wherein the reference voltage is generated by one or more combinations of transistors, capacitors, resistors, and inductors.

4. A system for filtering noise in a current filter circuit, the system comprising:
    a source transistor comprising a drain, a gate, and a source, wherein the source of the source transistor is coupled to a reference voltage terminal, the gate of the source transistor is coupled to the gate of a mirror transistor, and the drain of the source transistor is coupled to a reference current source;
    the mirror transistor comprising a drain, a gate, and a source, wherein the source of the mirror transistor is coupled to the reference voltage terminal, the gate is coupled to the gate of the source transistor, and the drain is coupled to a load;

a low pass filter for filtering noise in the current filter circuit, the low pass filter coupled between the drain of the mirror transistor and the reference voltage terminal, the input to the low pass filter being the drain of the mirror transistor and output being coupled to gate terminal of the mirror transistor and the source transistor, and an impedance reduction circuit coupled to the drain of the mirror transistor, wherein the impedance reduction circuit reduces bandwidth of the current filter circuit by reducing the gain of the source transistor.

5. The system of claim 4, wherein the impedance reduction circuit has low input impedance.

6. The system of claim 4, wherein the impedance reduction circuit is a resistor coupled to a reference voltage, wherein the reference voltage is generated by one or more combinations of transistors, capacitors, resistors, and inductors.

* * * * *